United States Patent
Suh

(10) Patent No.: US 7,911,065 B2
(45) Date of Patent: Mar. 22, 2011

(54) SEMICONDUCTOR PACKAGE HAVING A STACKED WAFER LEVEL PACKAGE AND METHOD FOR FABRICATING THE SAME

(75) Inventor: Min Suk Suh, Seoul (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 330 days.

(21) Appl. No.: 12/058,885

(22) Filed: Mar. 31, 2008

(65) Prior Publication Data

US 2009/0026629 A1 Jan. 29, 2009

(30) Foreign Application Priority Data

Jul. 27, 2007 (KR) .................. 10-2007-0076016

(51) Int. Cl.
*H01L 23/48* (2006.01)
(52) U.S. Cl. ........ 257/777; 257/737; 257/778; 257/786; 257/E23.01; 257/E23.021
(58) Field of Classification Search ............ 257/737, 257/777, 778, 786, E23.01, E23.021
See application file for complete search history.

(56) References Cited

U.S. PATENT DOCUMENTS

| 7,045,899 B2 * | 5/2006 | Yamane et al. ............. 257/777 |
| 2006/0125072 A1 * | 6/2006 | Mihara .................... 257/686 |
| 2006/0231958 A1 | 10/2006 | Yang |

FOREIGN PATENT DOCUMENTS

JP 2005-353837 A 12/2005

* cited by examiner

*Primary Examiner* — Andy Huynh
(74) *Attorney, Agent, or Firm* — Ladas & Parry LLP

(57) ABSTRACT

A semiconductor package having a stacked wafer level structure includes a base substrate; a semiconductor chip; a redistribution pattern; and a second insulation layer pattern. The base substrate having a chip region and a peripheral region disposed at the periphery of the chip region. The semiconductor chip is disposed over the chip region and has a bonding pad. The first insulation layer pattern covers the chip region and the peripheral region and exposes the bonding pad. The redistribution pattern is disposed over the first insulation layer pattern and extends from the bonding pad to the peripheral region. The second insulation layer pattern is disposed over the first insulation layer pattern and opening some portion of the redistribution pattern disposed in the peripheral region.

7 Claims, 8 Drawing Sheets

SEMICONDUCTOR PACKAGE HAVING A STACKED WAFER LEVEL PACKAGE AND METHOD FOR FABRICATING THE SAME

CROSS-REFERENCE TO RELATED APPLICATIONS

The present application claims priority to Korean patent application number 10-2007-0076016 filed on Jul. 27, 2007, which is incorporated herein by reference in its entirety.

BACKGROUND OF THE INVENTION

The present invention relates to a semiconductor package, a stacked wafer level package having the same and a method for fabricating the stacked wafer level package.

In recent, there have been developed a semiconductor chip adapted to store massive data and process the stored data in short time, and a semiconductor package having the semiconductor chip.

A semiconductor package is fabricated through a semiconductor chip fabrication process for fabricating a semiconductor chip by integrating devices such as a transistor, a resistor, a capacitor, etc. on a wafer and a packaging process for singulating the semiconductor chip from the wafer, connecting electrically it with an external circuit board and packaging the semiconductor chip with weak brittleness to protect it from external impact and/or vibration.

Recently, with development in packaging process technologies, there has been developed a wafer level package having a size no other than 100% to 105% of a semiconductor chip size and a stacked semiconductor package stacked with a plurality of semiconductor chips.

The wafer level package has advantages of less volume, less weight and high speed data processing.

In general, a wafer level package has a redistribution pattern connected with a bonding pad of a semiconductor chip and includes an insulation layer having an opening for exposing some portion of the redistribution pattern. To the redistribution pattern exposed by the opening of the insulation layer, a solder ball is attached.

Recently, in order to enhance data storage capacity and data processing speed of the wafer level package, studies for realizing "a stacked wafer level package" have been made. However, there has a problem that it is impossible to stack a plurality of wafer level packages due to the redistribution pattern disposed on a surface of the wafer level package and the solder ball attached to the redistribution pattern.

SUMMARY OF THE INVENTION

Embodiments of the present invention are directed to a semiconductor package which is stacked with a plurality of wafer level packages and thus is adapted to enhance a data storage capacity and a data processing speed.

Also, embodiments of the present invention are directed to a stacked wafer level package having the semiconductor package.

Further, embodiments of the present invention are directed to a method for fabricating the stacked wafer level package.

In one embodiment, a semiconductor package comprises a base substrate having a chip region and a peripheral region disposed at the periphery of the chip region; a semiconductor chip disposed over the chip region and having a bonding pad; a first insulation layer pattern covering the chip region and the peripheral region and exposing the bonding pad; a redistribution pattern disposed over the first insulation layer pattern and extended from the bonding pad to the peripheral region; and a second insulation layer pattern disposed over the first insulation layer pattern and opening some portion of the redistribution pattern disposed in the peripheral region.

The redistribution pattern is a plating layer.

The semiconductor package may further comprise a metal seed pattern interposed between the first insulation layer pattern and the redistribution pattern.

The base substrate is a bare wafer.

In another embodiment, a semiconductor package comprises a semiconductor chip having a bonding pad; a first insulation layer pattern covering the outside of the semiconductor chip and exposing the bonding pad; a redistribution pattern disposed over the first insulation layer pattern, extended from the bonding pad to the outside of the semiconductor chip; a connection pattern passing through the first insulation layer pattern at the outside of the semiconductor chip; and a second insulation layer pattern disposed over the first insulation layer pattern and having an opening for exposing some portion of the redistribution pattern.

The redistribution pattern and the connection pattern are formed integrally with each other.

The redistribution pattern and the connection pattern are plating layers.

The connection pattern connected with the redistribution pattern projected from the first insulation layer pattern.

The opening of the second insulation layer pattern is formed at the portion of the second insulation layer pattern, which faces to the semiconductor chip.

A solder ball is disposed over the redistribution pattern exposed by the opening.

The opening of the second insulation layer pattern may be formed at the portion of the second insulation layer pattern that corresponds to the connection pattern.

The opening of the second insulation layer pattern may include a first opening formed at the portion of the second insulation layer pattern which corresponds to the connection pattern, and a second opening formed at the portion of the second insulation layer pattern which faces to the semiconductor chip.

Yet another embodiment, a stacked wafer level package comprises a base substrate having a chip region and a peripheral region disposed at the periphery of the chip region; a first semiconductor chip disposed over the chip region and having a first bonding pad; a first insulation layer pattern covering the chip region and the peripheral region and exposing the first bonding pad; a first redistribution pattern connected with the first bonding pad and extended from the first bonding pad to the peripheral region; a second insulation layer disposed over the first insulation layer and opening some portion of the first redistribution pattern disposed in the peripheral region; a second semiconductor chip disposed in the chip region of the second insulation layer pattern and having a second bonding pad; a third insulation layer pattern covering the second semiconductor chip and the peripheral region and exposing the second bonding pad, the third insulation layer pattern having a through hole for exposing some portion of the first redistribution pattern disposed in the peripheral region; a second redistribution pattern connected with the second bonding pad and having a connection pattern electrically connected with the first redistribution pattern through the through hole; and a fourth insulation layer pattern covering the second redistribution pattern, the fourth insulation layer pattern having an opening exposing some portion of the second redistribution pattern.

The base substrate is a bare wafer.

The opening of the fourth insulation layer pattern exposes some portion of the second redistribution pattern that faces the second semiconductor chip.

The opening of the fourth insulation layer pattern may expose the portion corresponding to the connection pattern disposed in the peripheral region of the second semiconductor chips.

The opening of the fourth insulation layer pattern may include a first opening exposing some portion of the second redistribution pattern that face the second semiconductor chip and a second opening exposing some portion of the second redistribution pattern disposed in the peripheral region.

The first and second semiconductor chips have different sizes from each other.

In still yet another embodiment, a method for fabricating a semiconductor package comprises the steps of: disposing a first semiconductor chip having a first bonding pad over a chip region of a base substrate, the base substrate having the chip region and a peripheral region disposed at the periphery of the chip region; forming a first insulation layer pattern, the first insulation layer pattern covering the chip region and the peripheral region and exposing the first bonding pad; forming a first redistribution pattern, the first redistribution pattern extended from the first bonding pad to the peripheral region; forming a second insulation layer pattern over the first insulation layer pattern, the second insulation layer pattern opening some part of the first redistribution pattern disposed in the peripheral region; forming a second semiconductor chip having a second bonding pad over the second insulation layer pattern; forming a third insulation layer pattern over the second insulation layer pattern, the third insulation layer pattern covering the chip region and the peripheral region, exposing the second bonding pad and having a through hole exposing some portion of the redistribution pattern disposed in the peripheral region; forming a second redistribution pattern over the third insulation layer pattern, the second redistribution pattern being connected with the second bonding pad and having a connection pattern electrically connected with the first redistribution pattern through the through hole; and forming a fourth insulation layer pattern over the third insulation layer pattern, the fourth insulation layer pattern covering the second redistribution pattern and having an opening for exposing some portion of the second redistribution pattern.

DESCRIPTION OF SPECIFIC EMBODIMENTS

Figure 1:
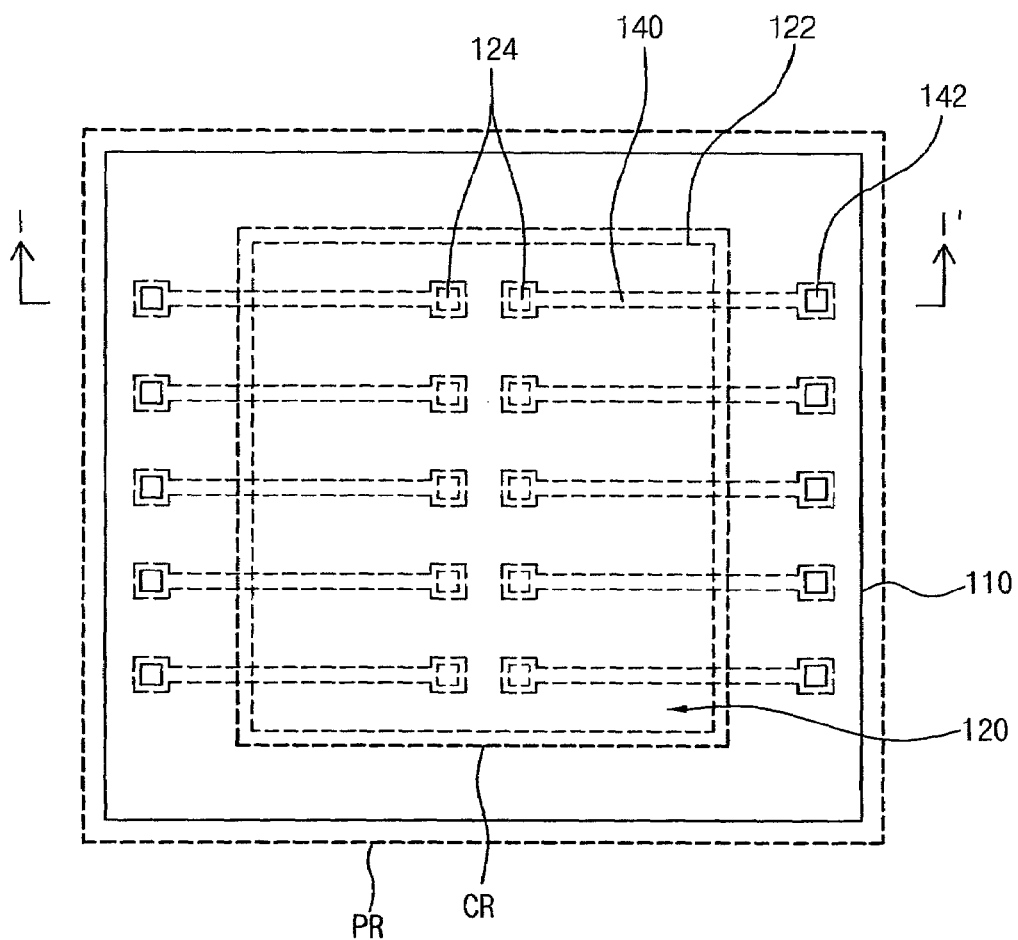
FIG. 1 is a plan view illustrating a semiconductor package in accordance with an embodiment of the present invention.
Figure 2:
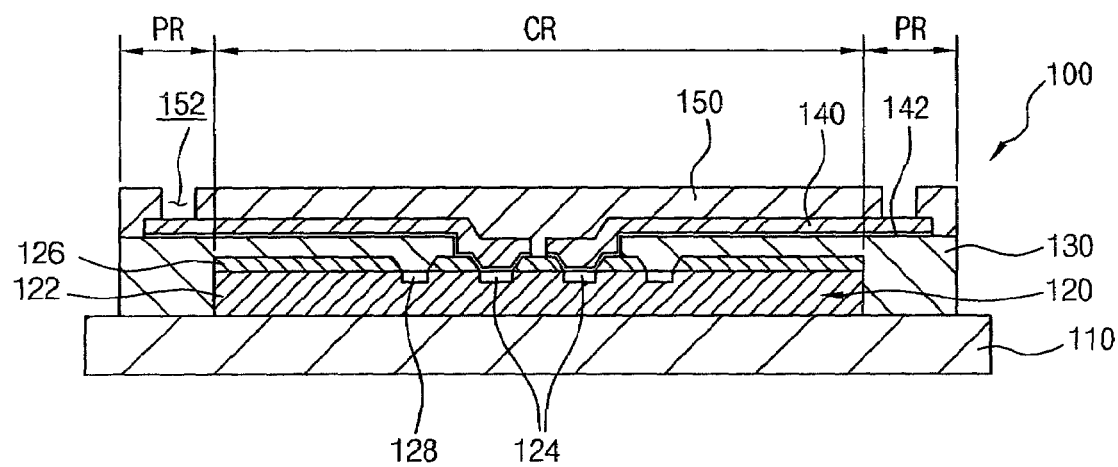
FIG. 2 is a cross-sectional view taken along the line I-I' of FIG. 1.

FIG. 1 is a plan view illustrating a semiconductor package in accordance with an embodiment of the present invention. FIG. 2 a cross-sectional view taken along the line I-I' of FIG. 1.

A semiconductor package 100 shown in FIGS. 1 and 2 is a wafer level package and has a structure adapted to realize "a stacked wafer level package".

Referring to FIGS. 1 and 2, the semiconductor package 100 includes a base substrate 110, a semiconductor chip 120, a first insulation layer pattern 130, a redistribution pattern 140 and a second insulation layer pattern 150.

The base substrate 110 may be, e.g., a bare wafer. Alternatively, the base substrate 110 may include a synthetic resin substrate or a printed circuit board.

The base substrate 110 has, e.g., a rectangular parallelepiped shape. The base substrate 110 having a rectangular parallelepiped shape includes a chip region CR and a peripheral region PR.

The chip region CR is formed at the middle of the base substrate 110 and the peripheral region PR is formed at the periphery of the chip region CR.

The semiconductor chip 120 is disposed over the chip region CR of the base substrate 110. The semiconductor chip 120 may include a semiconductor chip body 122, a data storage part (not shown), a data processing part (not shown), a bonding pad 124 and a protective layer pattern 126. In addition, the semiconductor chip 120 may further include a fuse box 128.

The semiconductor chip body 122 has, e.g., a rectangular parallelepiped shape, and the data storage part, the data processing part, the bonding pad 124 and the protective layer pattern 126 are disposed in the semiconductor chip body 122.

The data storage part serves to store data and the data processing part serves to calculate the data.

The bonding pad 124 is disposed over an upper surface of the semiconductor chip body 122 and electrically connected with the data storage part and the data processing part. The bonding pad 124 is disposed at, e.g., the middle of the upper surface of the semiconductor chip body 122.

The protective layer pattern 126 is disposed over the upper surface of the semiconductor chip body 122 and has an opening for exposing the bonding pad 124. The protective layer pattern 126 may include an oxide or a nitride.

The fuse box 128 includes a plurality of fuses (not shown) for repairing devices, such as a transistor and a capacitor, which store the data in the data storage part.

The first insulation layer pattern 130 covers not only the chip region CR but also the peripheral region PR. The first insulation layer pattern 130 has an opening for exposing the bonding pad 124 formed over the upper surface of the semiconductor chip body 122. In the present embodiment, the first insulation layer pattern 130 may be an organic layer.

The redistribution pattern 140 is disposed over the first insulation layer pattern 130. An example of a material that could be used for the redistribution pattern 140 may include copper, aluminum, aluminum alloy, etc.

The redistribution pattern 140 has a linear shape when viewed from the top. An end of the redistribution pattern 140 having a linear shape is electrically connected with the bonding pad 124 exposed by the first insulation layer pattern 130 and the other end of the redistribution pattern 140 is extended to the peripheral region PR through the chip region CR along the first insulation layer pattern 130.

A metal seed pattern 142 may be disposed between the redistribution pattern 140 and the first insulation layer pattern 130. The metal seed pattern 142 is needed when forming the redistribution pattern 140 by plating. An example of material for the metal seed pattern 142 may include titanium, nickel, vanadium, etc.

The second insulation layer pattern 150 is disposed over the first insulation layer pattern 130 and has an opening for exposing some portion of the redistribution pattern 140 disposed in the peripheral region PR.

As described above in detail, the semiconductor package 100 in accordance with the present embodiment has a structure adapted to realize a stacked wafer level package by selectively exposing the portion, disposed in the peripheral region PR, of the redistribution pattern 140 extended from the chip region CR, over which the semiconductor chip 120 is disposed, to the peripheral region PR disposed at the periphery of the chip region CR.

Figure 3:
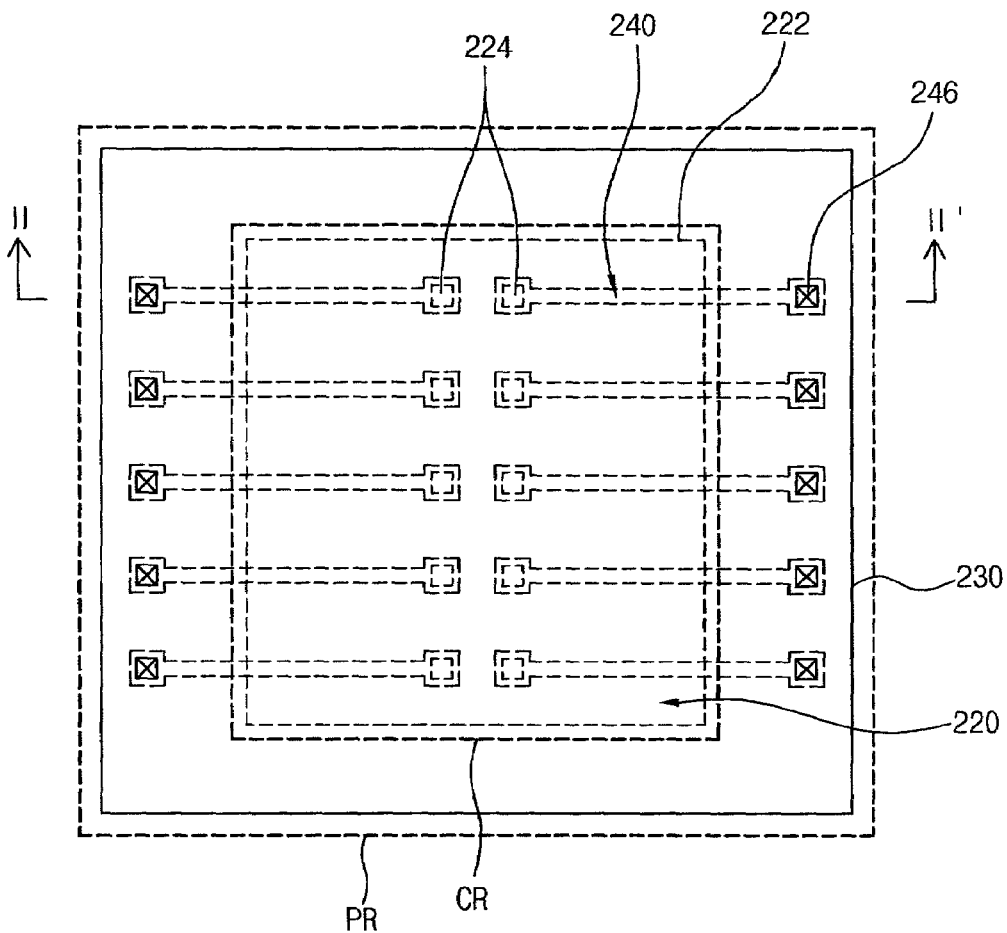
FIG. 3 is a plan view illustrating a semiconductor package in accordance with another embodiment of the present invention.
Figure 4:
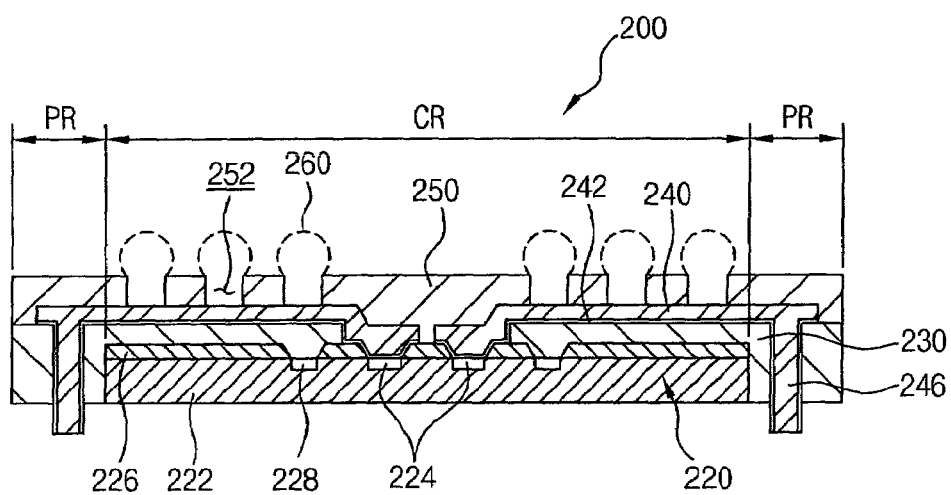
FIG. 4 is a cross-sectional view taken along the line II-II' of FIG. 3.

FIG. 3 is a plan view illustrating a semiconductor package in accordance with another embodiment of the present invention. FIG. 4 is a cross-sectional view taken along the line II-II' of FIG. 3.

A semiconductor package 200 shown in FIGS. 3 and 4 is a wafer level package and has a structure adapted to realize "a stacked wafer level package".

Referring to FIGS. 3 and 4, the semiconductor package 200 includes a semiconductor chip 220, a first insulation layer pattern 230, a redistribution pattern 240, a connection pattern 246 and a second insulation layer pattern 250.

The semiconductor chip 220 is disposed over a chip region CR. The semiconductor chip 220 may include a semiconductor chip body 222, a data storage part (not shown), a data processing part (not shown), a bonding pad 224 and a protective layer pattern 226. In addition, the semiconductor chip 220 may further include a fuse box 228.

The semiconductor chip body 222 has, e.g., a rectangular parallelepiped shape, and the data storage part, the data processing part, the bonding pad 224 and the protective layer pattern 226 are disposed in the semiconductor chip body 222.

The data storage part serves to store data and the data processing part serves to calculate the data.

The bonding pad 224 is disposed over an upper surface of the semiconductor chip body 222 and electrically connected with the data storage part and the data processing part. The bonding pad 224 is disposed at, e.g., the middle of the upper surface of the semiconductor chip body 222.

The protective layer pattern 226 is disposed over the upper surface of the semiconductor chip body 222 and has an opening for exposing the bonding pad 224. The protective layer pattern 226 may include an oxide or a nitride.

The fuse box 228 includes a plurality of fuses (not shown) for repairing devices, such as a transistor and a capacitor, which store the data in the data storage part.

The first insulation layer pattern 230 covers not only the semiconductor chip 220 disposed over the chip region CR but also the peripheral region PR formed at the periphery of the chip region CR. Therefore, the first insulation layer pattern 230 covers upper surface and side surface of the semiconductor chip 220 together.

Meanwhile, the first insulation layer pattern 230 has an opening for exposing the bonding pad 224 formed over the upper surface of the semiconductor chip body 222. In the present embodiment, the first insulation layer pattern 230 may be an organic layer.

The redistribution pattern 240 is disposed over the first insulation layer pattern 230. An example of a material that could be used for the redistribution pattern 240 may include copper, aluminum, aluminum alloy, etc.

The redistribution pattern 240 has a linear shape when viewed from the top. An end of the redistribution pattern 240 having a linear shape is electrically connected with the bonding pad 224 exposed by the first insulation layer pattern 230 and the other end of the redistribution pattern 240 is extended to the peripheral region PR of the first insulation layer pattern 230 through the chip region CR along the first insulation layer pattern 230.

The connection pattern 246 is electrically connected to the redistribution pattern 240. For example, the connection pattern 246 is formed integrally with the redistribution pattern 240. The connection pattern 246 is disposed at the portion of the redistribution pattern 240 which is disposed the peripheral region of the first insulation layer pattern 230, and is formed so as to pass through upper and lower surfaces of the first insulation layer pattern 230.

Meanwhile, an end of the connection pattern 246, which is opposite to the other end of the connection pattern 246 electrically connected with the redistribution pattern 240, is projected, e.g., to a predetermined extent from the lower surface of the first insulation layer pattern 230.

A metal seed pattern 242 may be disposed between the redistribution pattern 240 and the first insulation layer pattern 230. The metal seed pattern 242 is needed when forming the redistribution pattern 240 by plating. An example of material for the metal seed pattern 242 may include titanium, nickel, vanadium, etc.

The second insulation layer pattern 250 is disposed over the first insulation layer pattern 230 and has an opening for exposing some portion of the redistribution pattern 240 disposed in the peripheral region PR.

In the present embodiment, the redistribution pattern 240 exposed by the second insulation layer pattern 250 may be attached with, e.g., a solder ball 260.

As described above in detail, the semiconductor package 200 in accordance with the present embodiment has a structure adapted to realize a stacked wafer level package by disposing the connection pattern electrically connected to the redistribution pattern 240 extended from the chip region CR, over which the semiconductor chip 220 is disposed, to the peripheral region PR disposed at the periphery of the chip region CR and the connection pattern electrically connected with the portion of the redistribution pattern 240 which is disposed at the peripheral region PR.

Figure 5:
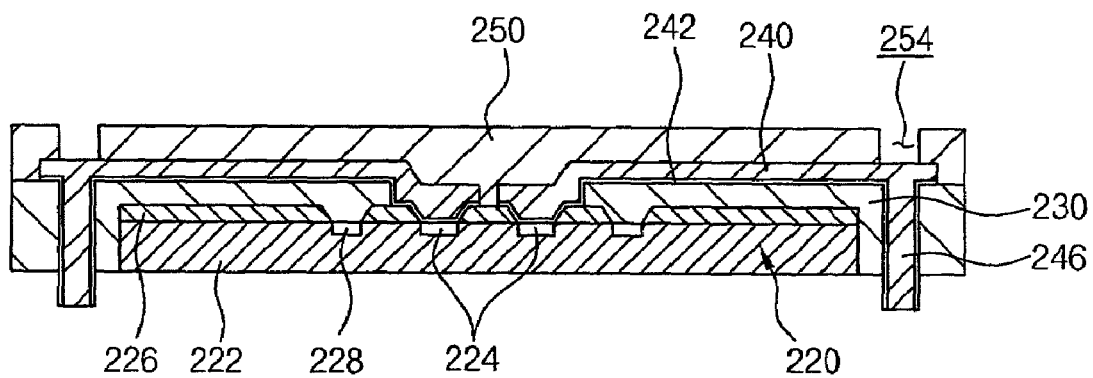
FIG. 5 is a cross-sectional view illustrating a semiconductor package in accordance with further another embodiment of the present invention.

FIG. 5 is a cross-sectional view illustrating a semiconductor package in accordance with further another embodiment of the present invention. The semiconductor package shown in FIG. 5 is substantially the same as the semiconductor package described above with reference to FIGS. 3 and 4, except for the second insulation layer pattern. Therefore, duplicated description to the same parts will be omitted and same name and same reference symbol will be given to the same part.

Referring to FIG. 5, a semiconductor package 200 includes a semiconductor chip 220, a first insulation layer pattern 230, a redistribution pattern 240, a connection pattern 246 and a second insulation layer pattern 250.

The second insulation layer pattern 250 which covers the redistribution pattern 240 has an opening for selectively exposing the portion of the redistribution pattern 240 which corresponds to the connection pattern 246.

As described above in detail, the semiconductor package 200 in accordance with the present embodiment has a structure adapted to realize a stacked wafer level package by stacking at least three semiconductor packages using the opening 254 for exposing the connection pattern 246.

Figure 6:
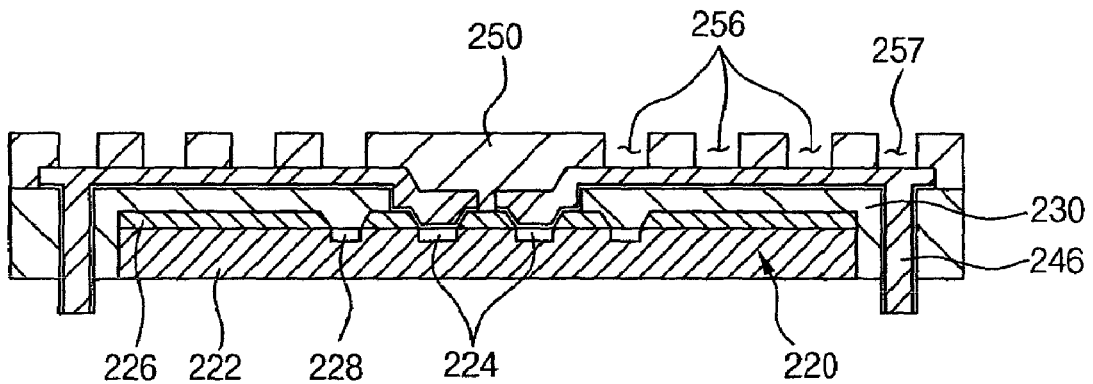
FIG. 6 is a cross-sectional view illustrating a semiconductor package in accordance with yet another embodiment of the present invention.

FIG. 6 is a cross-sectional view illustrating a semiconductor package in accordance with yet another embodiment of the present invention. The semiconductor package shown in FIG. 6 is substantially the same as the semiconductor package described above with reference to FIGS. 3 and 4, except for the second insulation layer pattern. Therefore, duplicated description to the same parts will be omitted and same name and same reference symbol will be given to the same part.

Referring to FIG. 6, a semiconductor package 200 includes a semiconductor chip 220, a first insulation layer pattern 230, a redistribution pattern 240, a connection pattern 246 and a second insulation layer pattern 250.

The second insulation layer pattern 250 which covers the redistribution pattern 240 has a first opening 256 and a second opening 257.

The first opening 256 exposes some portion of the redistribution 240 disposed in the chip region CR and the second opening 257 exposes selectively the portion of the redistribution pattern 240 corresponding to the connection pattern 246.

As described above in detail, the semiconductor package 200 in accordance with the present embodiment has a structure adapted to realize a stacked wafer level package by stacking at least three semiconductor packages using the first opening 256 for exposing the portion of the redistribution pattern 240 in the chip region CR and the second opening 257 for exposing the connection pattern 246 in the peripheral region PR.

Figure 7:
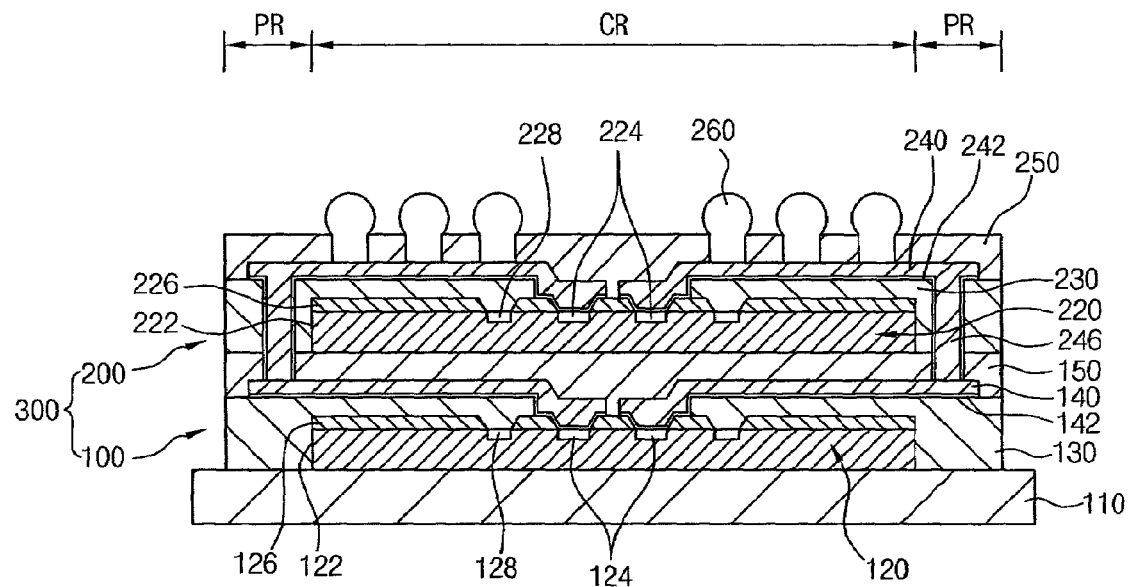
FIG. 7 is a cross-sectional view a stacked wafer level package in accordance with an embodiment of the present invention.

FIG. 7 is a cross-sectional view a stacked wafer level package in accordance with an embodiment of the present invention.

Referring to FIG. 7, a stacked wafer level package 300 includes a base substrate 110, a first wafer level package 100 and a second wafer level package 200. The second wafer level package 200 is disposed over the first wafer level package 100 and the first and second wafer level packages 100 and 200 are electrically connected with each other.

The base substrate 110 supports the first wafer level package 100 and the second wafer level package 200.

The base substrate 110 may be, e.g., a bare wafer. Alternatively, the base substrate 110 may include a synthetic resin substrate or a printed circuit board.

The base substrate 110 has, e.g., a rectangular parallelepiped shape. The base substrate 110 having a rectangular parallelepiped shape includes a chip region CR and a peripheral region PR.

The chip region CR has substantially the same shape and area as the plane of the first wafer level package 100 which will be described later. The chip region is formed, e.g., at the middle of the base substrate 110. Meanwhile, the peripheral region PR is formed at the periphery of the chip region CR.

The first wafer level package 100 includes a first semiconductor chip 120, a first insulation layer pattern, a first redistribution pattern 140 and a second insulation layer pattern 150.

The first semiconductor chip 120 is disposed over the chip region CR of the base substrate 110. The first semiconductor chip 120 may include a semiconductor chip body 122, a data storage part (not shown), a data processing part (not shown), a first bonding pad 124 and a protective layer pattern 126. In addition, the first semiconductor chip 120 may further include a fuse box 128.

The semiconductor chip body 122 has, e.g., a rectangular parallelepiped shape, and the data storage part, the data processing part, the first bonding pad 124 and the protective layer pattern 126 are disposed in the semiconductor chip body 122.

The data storage part serves to store data and the data processing part serves to calculate the data.

The first bonding pad 124 is disposed over an upper surface of the semiconductor chip body 122 and electrically connected with the data storage part and the data processing part. The first bonding pad 124 is disposed at, e.g., the middle of the upper surface of the semiconductor chip body 122.

The protective layer pattern 126 is disposed over the upper surface of the semiconductor chip body 122 and has an opening for exposing the bonding pad 124. The protective layer pattern 126 may include an oxide or a nitride.

The fuse box 128 includes a plurality of fuses (not shown) for repairing devices, such as a transistor and a capacitor, which store the data in the data storage part.

The first insulation layer pattern 130 covers not only the chip region CR but also the peripheral region PR. The first insulation layer pattern 130 has an opening for exposing the first bonding pad 124 formed over the upper surface of the semiconductor chip body 122. In the present embodiment, the first insulation layer pattern 130 may be an organic layer.

The first redistribution pattern 140 is disposed over the first insulation layer pattern 130. An example of a material that could be used for the first redistribution pattern 140 may include copper, aluminum, aluminum alloy, etc.

The first redistribution pattern 140 has a linear shape when viewed from the top. An end of the first redistribution pattern 140 having a linear shape is electrically connected with the first bonding pad 124 exposed by the first insulation layer pattern 130 and the other end of the first redistribution pattern 140 is extended to the peripheral region PR through the chip region CR along the first insulation layer pattern 130.

A metal seed pattern 142 may be disposed between the first redistribution pattern 140 and the first insulation layer pattern 130. The metal seed pattern 142 is needed when forming the first redistribution pattern 140 by plating. An example of material for the metal seed pattern 142 may include titanium, nickel, vanadium, etc.

The second insulation layer pattern 150 is disposed over the first insulation layer pattern 130 and has an opening for exposing some portion of the first redistribution pattern 140 disposed in the peripheral region PR.

Referring again to FIG. 7, the second wafer level package 200 includes a second semiconductor chip 220, a third insulation layer pattern 230, a second redistribution pattern 240, a connection pattern 246 and a fourth insulation layer pattern 250.

The second semiconductor chip 220 is disposed over the second insulation layer pattern 150 of the first wafer level package 100 and the second semiconductor chip 220 is disposed over the chip region CR.

The second semiconductor chip 220 may include a semiconductor chip body 222, a data storage part (not shown), a data processing part (not shown), a second bonding pad 224 and a protective layer pattern 226. In addition, the semiconductor chip 220 may further include a fuse box 228.

The semiconductor chip body 222 has, e.g., a rectangular parallelepiped shape, and the data storage part, the data processing part, the second bonding pad 224 and the protective layer pattern 226 are disposed in the semiconductor chip body 222.

The data storage part serves to store data and the data processing part serves to calculate the data.

The second bonding pad 224 is disposed over an upper surface of the semiconductor chip body 222 and electrically connected with the data storage part and the data processing part. The second bonding pad 224 is disposed at, e.g., the middle of the upper surface of the semiconductor chip body 222.

The protective layer pattern 226 is disposed over the upper surface of the semiconductor chip body 222 and has an opening for exposing the second bonding pad 224. The protective layer pattern 226 may include an oxide or a nitride.

The fuse box 228 includes a plurality of fuses (not shown) for repairing devices, such as a transistor and a capacitor, which store the data in the data storage part.

The third insulation layer pattern 230 is disposed over the second insulation layer pattern 150 of the first wafer level package 100. The third insulation layer pattern 230 covers not only the second semiconductor chip 220 disposed over the chip region CR but also the peripheral region PR formed at the periphery of the chip region CR. Therefore, the third insulation layer pattern 230 covers upper surface and side surface of the second semiconductor chip at the same time.

Meanwhile, the third insulation layer pattern 230 has an opening for exposing the second bonding pad 224 formed over the upper surface of the semiconductor chip body 222 and a through hole for exposing some portion of the first redistribution pattern 140 disposed in the peripheral region PR. In the present embodiment, the third insulation layer pattern 230 may be an organic layer.

The second redistribution pattern 240 is disposed over the third insulation layer pattern 230. An example of a material that could be used for the second redistribution pattern 240 may include copper, aluminum, aluminum alloy, etc.

The second redistribution pattern 240 has a linear shape when viewed from the top. An end of the second redistribution pattern 240 having a linear shape is electrically connected with the second bonding pad 224 exposed by the third insulation layer pattern 230 and the other end of the second redistribution pattern 240 is extended to the peripheral region PR of the third insulation layer pattern 230 through the chip region CR along the third insulation layer pattern 230.

An end of the connection pattern 246 is electrically connected to the second redistribution pattern 240 and the opposite end of the connection pattern 246 is electrically connected with the first redistribution pattern 140 exposed by the opening formed in the second insulation layer pattern 150 of the first wafer level package 100 through the through hole formed in the third insulation layer pattern 230.

The opposite end of the connection pattern 246 is projected to a predetermined extent from the third insulation layer pattern 230 so as to be electrically connected with the first redistribution pattern 140 of the first wafer level package 100.

A metal seed pattern 242 may be disposed between the second redistribution pattern 240 and the third insulation layer pattern 230. The metal seed pattern 242 is needed when forming the second redistribution pattern 240 by plating. An example of material for the metal seed pattern 242 may include titanium, nickel, vanadium, etc.

The fourth insulation layer pattern 250 is disposed over the third insulation layer pattern 230 and has an opening for exposing some portion of the second redistribution pattern 240 disposed in the peripheral region PR.

In the present embodiment, the second redistribution pattern 240 exposed by the fourth insulation layer pattern 250 may be attached with, e.g., a solder ball 260.

In the embodiment shown in FIG. 7, realizing the stacked wafer level package 300 using, e.g., the first wafer level package 100 and the second wafer level package 200 is illustrated and described.

Alternatively, it is possible to realization of a stacked wafer level package stacked with at least three wafer level packages by forming, as shown in FIG. 5, an opening for exposing the portion of the second redistribution pattern 240 corresponding to the connection pattern 246 in the fourth insulation layer pattern 250 which covers the second redistribution pattern.

Meanwhile, three kinds of wafer level packages having different structure from one another are required for realizing the stacked wafer level package stacked with at least three wafer level packages. Also alternatively, it is possible to realize a stacked wafer level package stacked with at least three wafer level packages only with two kinds of wafer level packages by forming, as shown in FIG. 6, a first opening for exposing the second redistribution pattern 240 in the chip region CR and the second opening for exposing the portion of the second redistribution pattern 240, which corresponds to the connection pattern in the peripheral region PR, in the fourth insulation layer 250 pattern which covers the second redistribution pattern 240.

Although, realization of a stacked wafer level package with wafer level packages having the same size is described in the present embodiment, it is possible to realize the stacked wafer level package using wafer level packages having different sizes from one another.

FIGS. 8 through 16 are cross-sectional views illustrating the steps of a method for fabricating a stacked wafer level package in accordance with an embodiment of the present invention.

In the present embodiment, e.g., two wafer level packages are stacked.

Figure 8:
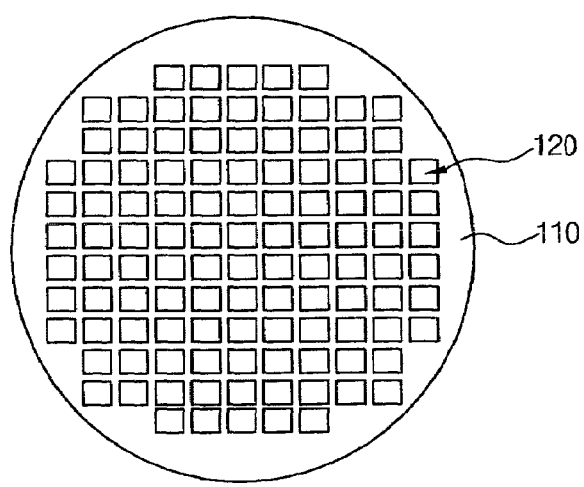
FIGS. 8 through 16 are cross-sectional views illustrating the steps of a method for fabricating a stacked wafer level package in accordance with an embodiment of the present invention.
Figure 9:
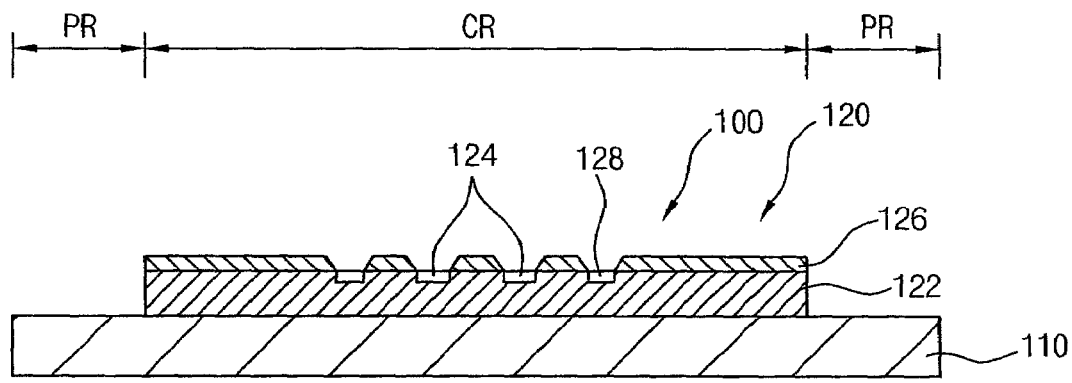

Referring to FIG. 8, after semiconductor chips (not shown) are fabricated over a wafer (not shown), good semiconductor chips of the fabricated semiconductor chips are sorted through a die sorting process.

The sorted good semiconductor chips are attached onto a base substrate 110, which is a bare wafer, in a matrix shape. Hereinafter, the good semiconductor chip attached onto the base substrate 110 is referred to as a first semiconductor chip 120. Also, the portion of the base substrate 110 onto which the first semiconductor chip is attached is referred to as a chip region CR and the periphery of the chip region CR is referred to as a peripheral region PR.

The first semiconductor chip 120 is formed with, e.g., a semiconductor chip body 122 having a data storage part and a data processing part, a first bonding pad 124 electrically connected with the data storage part and the data processing part, and a protective layer pattern 126 for covering the semiconductor chip body 122 and exposing the first bonding pad 124. In addition, the semiconductor chip body 122 may further be formed with a fuse box 128.

Figure 10:
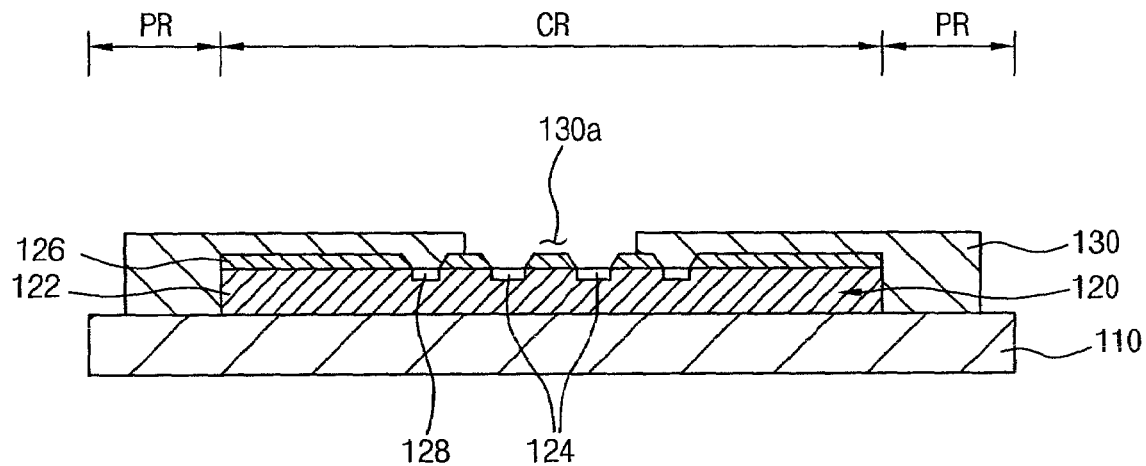
Figure 11:
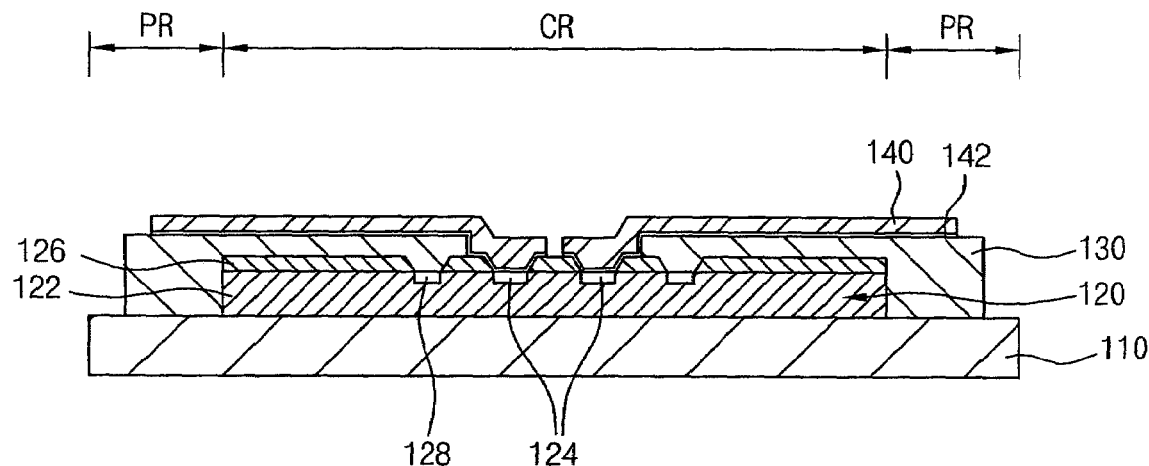

Referring to FIG. 10, after the first semiconductor chip 120 is attached onto the base substrate 110, a first insulation layer pattern 130 is formed over the base substrate 110.

In order to form the first insulation layer pattern 130, a first insulation layer (not shown) is formed over the base substrate 110 and thus the first semiconductor chip 120 is covered by the first insulation layer. For example, the first insulation layer includes an organic matter and a photosensitive material, and may be formed by a spin coating process or the like.

After formation of the first insulation layer, the first insulation layer is patterned by a photo process including an exposure process and a development process and thus the first insulation layer pattern 130, which covers the chip region CR and the peripheral region PR and has an opening 130a for exposing the first bonding pad 124, is formed over the base substrate 110.

After the formation of the first insulation layer pattern 130, a metal seed layer (not shown) is formed over the first insulation layer pattern 130. An example of material for the metal seed layer may include titanium, nickel, vanadium, metal alloy, etc. The metal seed layer is formed by a chemical vapor deposition (CVD) process and a physical vapor deposition (PVD) process such as a sputtering process.

After the formation of the metal seed layer, a photoresist film is formed over the metal seed layer. The photoresist film is patterned by a photo process to form a photoresist pattern over the metal seed layer. The photoresist pattern has an opening for exposing the portion of the metal seed layer to be formed with a first redistribution pattern which will be described later.

The first redistribution pattern 140 is formed over the exposed metal seed layer by plating using the photoresist pattern as a plate barrier layer. An example of a material that could be used for the first redistribution pattern 140 may include copper, aluminum, aluminum alloy, metal alloy, etc.

After the formation of the first redistribution pattern 140, the photoresist pattern is removed from the metal seed layer by an ashing process and/or a strip process. Subsequently, the metal seed layer is patterned using the first redistribution pattern 140 as an etching mask and thus a metal seed pattern 142 is formed between the first redistribution pattern 140 and the first insulation layer pattern 130.

Although the first redistribution pattern 140 is formed by plating in the present embodiment, the first redistribution pattern 140 may be formed by a photolithography process including a metal layer deposition, a photoresist pattern formation and a metal layer patterning.

Figure 12:
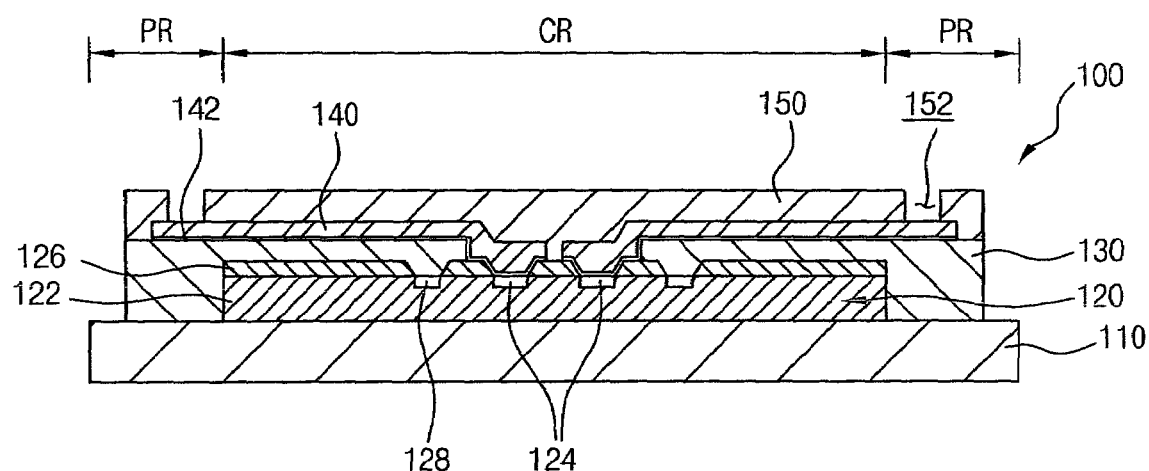

Referring to FIG. 12, after the formation of the first redistribution pattern 140, a second insulation layer pattern 150 is formed.

In order to form the second insulation layer pattern 150, a second insulation layer (not shown) which covers the chip region CR and the peripheral region PR is formed over the first insulation layer pattern 130. The second insulation layer may include, e.g., an organic matter and a photosensitive material. The second insulation layer may be formed by a spin coating process or the like.

The second insulation layer is patterned by the photo process and thus a second insulation layer pattern 150 having an opening 152 for exposing some portion of the first redistribution pattern 140 disposed over the peripheral region PR. Eventually, a first wafer level package 100 is fabricated.

Figure 13:
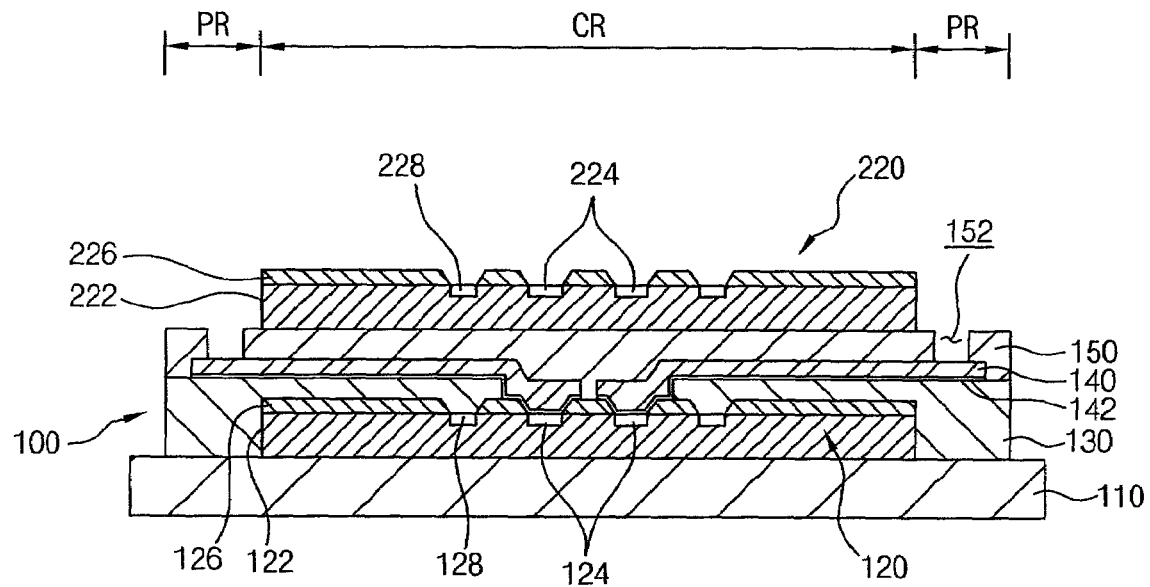

Referring to FIG. 13, a good second semiconductor chip 220 is disposed over the second insulation layer pattern 150. The second semiconductor chip 220 is disposed over the chip region CR. The second semiconductor chip 220 is formed with, e.g., a semiconductor chip body 222 having a data storage part and a data processing part, a second bonding pad 224 electrically connected with the data storage part and the data processing part, and protective layer patterns 226 for covering the semiconductor chip body 222 and exposing the second bonding pads 224. In addition, the semiconductor chip body 222 may further be formed with a fuse box 228.

Figure 14:
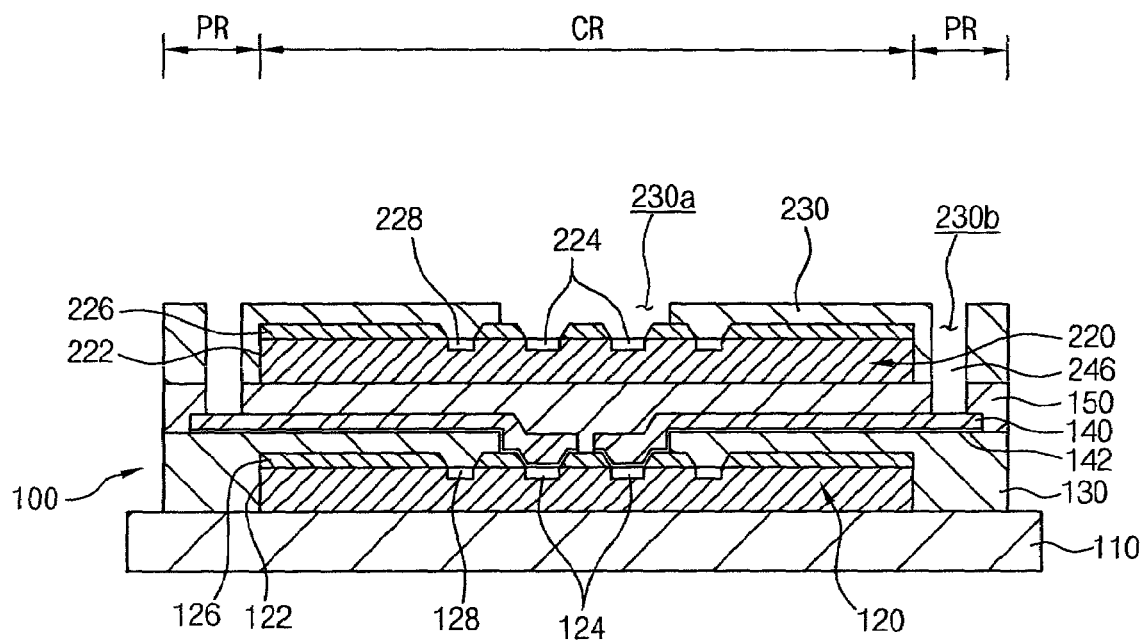

Referring to FIG. 14, after the second semiconductor chip 220 is attached onto the chip region CR, a third insulation layer pattern 230 which covers the chip region CR and the peripheral region PR is formed.

In order to form the third insulation layer pattern 230, a third insulation layer (not shown) is formed over the chip region CR and the peripheral region PR of the second insulation layer pattern 150 of the first wafer level package 100. The third insulation layer includes an organic matter and a photosensitive material, and is formed by a spin coating process or the like.

The third insulation layer is patterned by the photo process and thus the third insulation layer pattern 230 is formed over the second insulation layer pattern 150 of the first wafer level package 100. The third insulation layer pattern 230 has an opening 230a for exposing the bonding pad of the second semiconductor chip 220 and an opening 230b for exposing the opening 152 formed in the second insulation layer pattern 150 of the first wafer level package 100 shown in FIG. 12.

Figure 15:
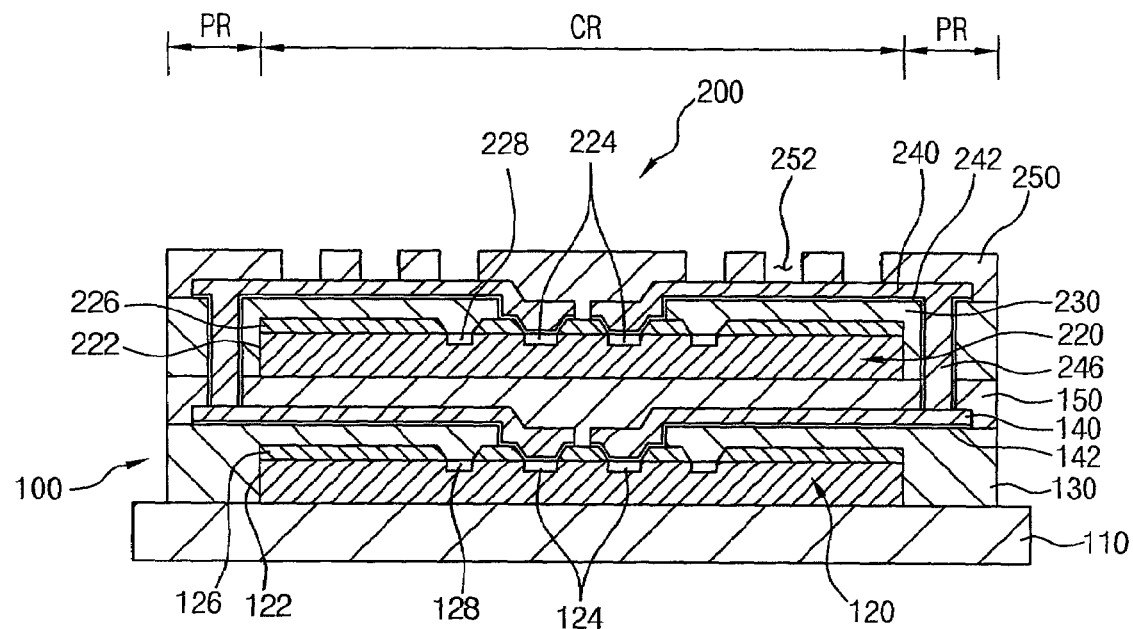

Referring to FIG. 15, after the formation of the third insulation layer pattern 230, a metal seed layer (not shown) is formed over the third insulation layer pattern 230. The metal seed layer is also formed over the inside surface of the third insulation layer pattern 230 formed by the openings 230a and 230b of the third insulation layer pattern 230. An example of material for the metal seed layer may include titanium, nickel, vanadium, metal alloy, etc. The metal seed layer is formed by a chemical vapor deposition (CVD) process and a physical vapor deposition (PVD) process such as a sputtering process.

After the formation of the metal seed layer, a photoresist film is formed over the metal seed layer. The photoresist film is patterned by a photo process to form a photoresist pattern over the metal seed layer. The photoresist pattern has an opening for exposing the portion of the metal seed layer to be formed with a second redistribution pattern which will be described later.

The second redistribution pattern 240 is formed over the exposed metal seed layer by plating using the photoresist pattern as a plate barrier layer. The second redistribution pattern 240 is disposed in a linear shape over the third insulation layer pattern 230. An end of the second redistribution pattern 240 is electrically connected with the second bonding pad 224 and the other end of the second redistribution pattern 240 is extended from the chip region CR to the peripheral region PR. An example of a material that could be used for the second redistribution pattern 240 may include copper, aluminum, aluminum alloy, metal alloy, etc.

During the formation of the second redistribution pattern 240, a connection pattern 246 electrically connected with the first redistribution pattern 140 of the first wafer level package 100 is formed in the inside of the opening 230b formed by the third insulation layer pattern 230.

After the formation of the second redistribution pattern 240 and the connection pattern 246, the photoresist pattern is removed from the metal seed layer by an ashing process and/or a strip process. Subsequently, the metal seed layer is patterned using the second redistribution pattern 240 as an etching mask and thus a metal seed pattern 242 is formed between the second redistribution pattern 240 and the third insulation layer pattern 230.

Although the third redistribution pattern 240 is formed by plating in the present embodiment, the third redistribution pattern 240 may be formed by a photolithography process including a metal layer deposition, a photoresist pattern formation and a metal layer patterning.

Referring again to FIG. 15, after the formation of the second redistribution pattern 240, a fourth insulation layer (not shown) which covers the chip region CR and the peripheral region PR of the third insulation layer pattern 230 is formed over the second redistribution pattern 240. The fourth insulation layer includes a photosensitive material and an organic matter.

The fourth insulation layer is patterned by the photo process and thus a fourth insulation layer pattern 250 having an opening is formed over the third insulation layer pattern 230, thereby fabricating a second wafer level package 200.

The fourth insulation layer pattern 250 of the second wafer level package 200 may include an opening 252 for exposing the second redistribution pattern 240 formed in the chip region CR. If the opening 252 for exposing the chip region CR is formed in the fourth insulation layer pattern 250, the stacked wafer level package in accordance with the present embodiment is stacked with two wafer level packages.

On the other hand, if the fourth insulation layer pattern 250 has an opening 254 for exposing some portion of the second redistribution pattern 240 formed in the peripheral region PR as shown in FIG. 5, it is possible to fabricate a stacked semiconductor package having more than three wafer level packages by stacking at least two second wafer level packages 200 in accordance with the present embodiment.

Meanwhile, as shown in FIG. 6, it is possible to fabricate a stacked semiconductor package having more than three wafer level packages by forming the first opening 256 for exposing some portion of the second redistribution pattern 240 in the chip region CR and the second opening 257 for exposing some portion of the second redistribution pattern 240 in the peripheral region PR, in the fourth insulation layer pattern 250 of the second wafer level package 200.

Figure 16:
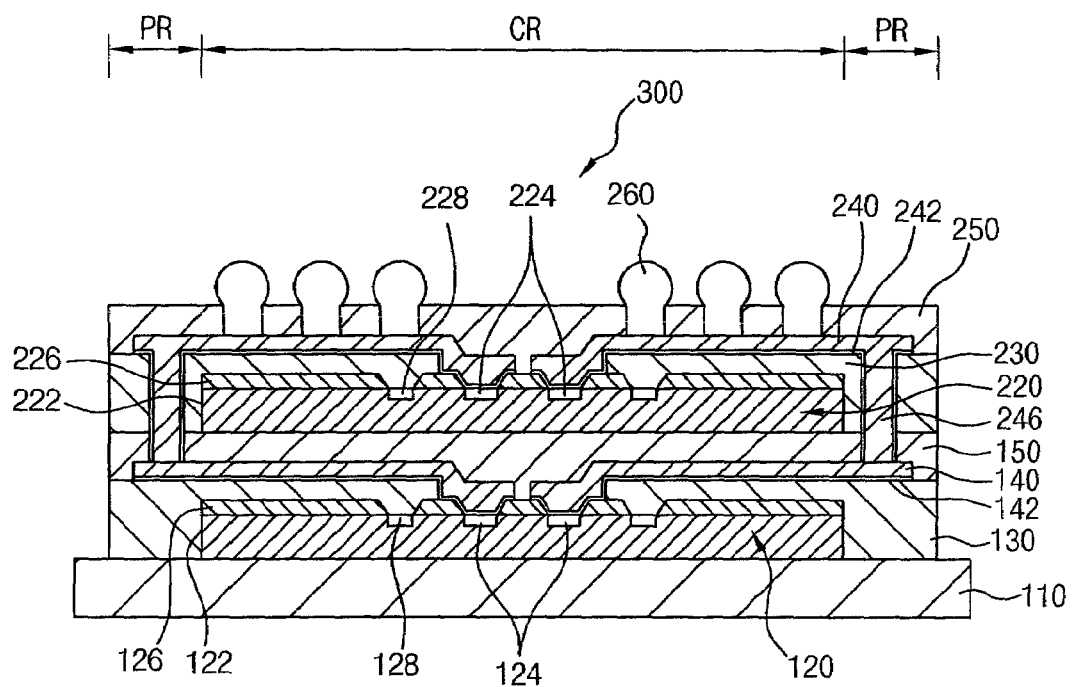

Referring to FIG. 16, a solder ball 260 is attached to the opening 252 formed in the chip region CR of the fourth insulation layer pattern 250 and therefore the stacked wafer level package 300 is fabricated.

As is apparent from the above description, a structure of a wafer level package is improved in the present invention and therefore it is possible to fabricate a stacked wafer level package capable of enhancing data storage capacity and data processing speed by stacking at least two wafer level packages.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package, comprising:
    a semiconductor chip having a bonding pad disposed over an upper surface of the semiconductor chip;
    a first insulation layer pattern for covering the upper surface and a side surface of the semiconductor chip and exposing the bonding pad;
    a redistribution pattern disposed over the first insulation layer pattern and extended from the bonding pad to the outside of the semiconductor chip, the redistribution pattern being formed integrally with a connection pattern passing through the first insulation layer pattern at the outside of the semiconductor chip, the connection pattern being projected from a lower surface of the first insulation layer pattern which is opposite to an upper surface of the first insulation layer pattern; and
    a second insulation layer pattern disposed over the first insulation layer pattern and having an opening exposing some portion of the redistribution pattern.

2. The semiconductor chip according to claim 1, wherein the opening of the second insulation layer pattern is formed at the portion of the second insulation layer pattern that corresponds to the connection pattern.

3. The semiconductor chip according to claim 1, wherein the opening of the second insulation layer pattern includes a first opening formed at the portion of the second insulation layer pattern that corresponds to the connection pattern, and a second opening formed at the portion of the second insulation layer pattern that faces the semiconductor chip.

4. A semiconductor package, comprising:
    a semiconductor chip having a bonding pad;
    a first insulation layer pattern for covering the outside of the semiconductor chip and exposing the bonding pad;
    a redistribution pattern disposed over the first insulation layer pattern and extended from the bonding pad to the outside of the semiconductor chip;
    a connection pattern passing through the first insulation layer pattern at the outside of the semiconductor chip; and
    a second insulation layer pattern disposed over the first insulation layer pattern and having an opening exposing some portion of the redistribution pattern,
    wherein the redistribution pattern and the connection pattern are formed integrally with each other.

5. The semiconductor package according to claim 4, wherein the redistribution pattern and the connection pattern are plating layers.

6. The semiconductor package according to claim 4, wherein the opening of the second insulation layer pattern is formed at the portion of the second insulation layer pattern that faces the semiconductor chip.

7. The semiconductor chip according to claim 6, wherein a solder ball is disposed over the redistribution pattern exposed by the opening of the second insulation layer pattern.

* * * * *